(12) United States Patent
Sukemi et al.

(10) Patent No.: US 8,836,098 B1
(45) Date of Patent: Sep. 16, 2014

(54) SURFACE MOUNT SEMICONDUCTOR DEVICE WITH SOLDER BALL REINFORCEMENT FRAME

(71) Applicants: Norazham Mohd Sukemi, Subang (MY); Navas Khan Oratti Kalandar, Petaling Jaya (MY); Kesvakumar V. C Muniandy, Klang (MY)

(72) Inventors: Norazham Mohd Sukemi, Subang (MY); Navas Khan Oratti Kalandar, Petaling Jaya (MY); Kesvakumar V. C Muniandy, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/894,440

(22) Filed: May 15, 2013

(51) Int. Cl.
- H01L 23/02 (2006.01)
- H01L 23/48 (2006.01)
- H01L 23/52 (2006.01)
- H01L 21/44 (2006.01)
- H01L 23/00 (2006.01)
- H01L 23/498 (2006.01)

(52) U.S. Cl.
CPC .......... *H01L 23/49816* (2013.01); *H01L 24/81* (2013.01)
USPC ........... 257/678; 257/734; 257/737; 257/738; 438/106; 438/612

(58) Field of Classification Search
CPC ............ H01L 21/4853; H01L 21/4857; H01L 21/4875; H01L 21/563; H01L 21/58; H05K 1/112–1/115; H05K 1/144; H05K 1/16; H05K 3/341; H05K 3/3452
USPC .......... 438/106–108, 612, 613; 257/678, 734, 257/737, 738, 774; 361/761, 764; 174/255, 174/257, 260, 262
See application file for complete search history.

(56) References Cited

U.S. PATENT DOCUMENTS

| | | | |
|---|---|---|---|
| 6,400,033 B1 | 6/2002 | Darveaux | |
| 8,541,691 B2 * | 9/2013 | Kariya et al. | 174/260 |
| 2008/0002460 A1 * | 1/2008 | Tuckerman et al. | 365/158 |
| 2008/0042270 A1 | 2/2008 | Cromer et al. | |
| 2009/0102050 A1 | 4/2009 | Hsu | |
| 2009/0237900 A1 * | 9/2009 | Origuchi et al. | 361/763 |
| 2011/0169170 A1 * | 7/2011 | Baba et al. | 257/774 |
| 2012/0273937 A1 * | 11/2012 | Choi | 257/737 |

* cited by examiner

*Primary Examiner* — Hsien Ming Lee
(74) *Attorney, Agent, or Firm* — Charles Bergere

(57) ABSTRACT

A surface mount semiconductor device having external contact elements exposed in a ball grid array (BGA) at its external active face for mechanical and electrical connection to an external support and a semiconductor die connected electrically internally with the external contact elements. A reinforcement layer of electrically insulating material extends between and surrounds laterally peripheral contact elements of the BGA. The reinforcement layer extends to from about thirty percent (30%) to about fifty percent (50%) of the height of the peripheral contact elements at the active face.

13 Claims, 5 Drawing Sheets

US 8,836,098 B1

SURFACE MOUNT SEMICONDUCTOR DEVICE WITH SOLDER BALL REINFORCEMENT FRAME

BACKGROUND OF THE INVENTION

The present invention is directed to a surface mount semiconductor device and, more particularly, to a surface mount device with a solder ball reinforcement frame.

Semiconductor device packaging fulfils basic functions such as providing electrical connections and protecting the die against mechanical and environmental stresses. Semiconductor devices are commonly packaged for surface mounting by embedding one or more semiconductor dies in an encapsulation material. Electrical contacts for connection with external circuits are exposed in an active face of the package and are connected internally with electrical contact pads on the semiconductor die. Various techniques are available for connecting the exposed electrical contacts of the package with external circuits.

FIG. 1 shows a conventional controlled collapse chip carrier connection (C5) semiconductor device 100. The semiconductor device 100 comprises one or more singulated semiconductor dies 102 embedded in a molding compound 104 and having electrical contact solder elements such as 106 of a ball grid array (BGA) on an active face of the die 102. The semiconductor die 102 is mounted on a laminated substrate 108 that has electrically conductive layers and vias separated by insulating layers, and back face electrical contacts 110 formed on the back face of the substrate 108 to provide interconnections between the BGA of the semiconductor die 102 and an array of active face internal electrical contact pads 112 on the active face 114 of the substrate 108. A further array of electrical contact solder elements 116 form an external BGA on the active face 114 of the device 100. Patterning of the electrically conductive layers and vias in the substrate 108 enables the array of pads 106 on the semiconductor die 102 to be redistributed geometrically, so that the BGAs 112, 116 on the active face 114 of the device 100 may have a different geometry from the BGA on the active face of the semiconductor die 102. A solder mask 118 is formed on the active face 114 of the device. The solder mask 118 is applied to the substrate 108 by silk-screening or spraying a thin layer of lacquer or other polymer to protect the electrical contact pads 112 from oxidation and to prevent solder bridges from forming between closely spaced solder pads. Openings are etched in the solder mask 118 for the individual external electrical contact solder elements 116 to contact the electrical contact pads 112. The electrical contact elements 116 of the external BGA are placed on the contact pads 112 on the active face 114 of the substrate 108 and are held in place with a sticky flux until in use the assembly is heated in order to solder the device 100 to an external PCB (not shown).

When fabrication of the semiconductor device 100 is complete, it is delivered to the next phase of integration in a system, typically to a customer. During handling of the completed device 100, there is a risk of damage to the external BGA. Individual electrical contact elements 116, especially in the periphery close to the edges of the device 100 may be damaged or knocked away. The solder mask 118 provides no significant protection to the BGA, because it is thin and its material is not robust.

Therefore, it is desirable to reinforce the mechanical connections and increase the reliability of the electrical connections established by the external electrical contacts in use when the device is mounted on the external support.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS OF THE INVENTION

Figure 1:
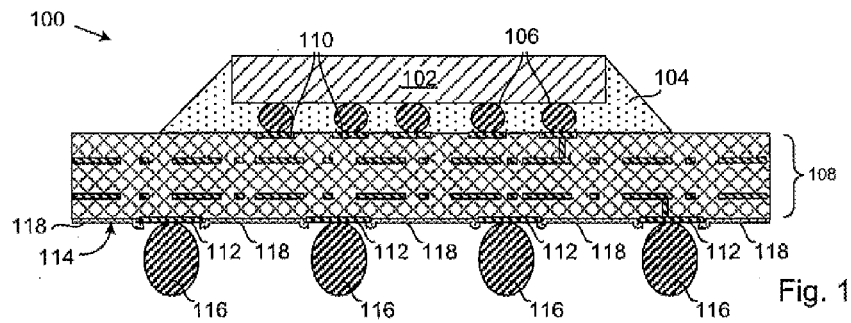
FIG. 1 is a schematic cross-sectional view of a conventional surface mount semiconductor device.
Figure 2:
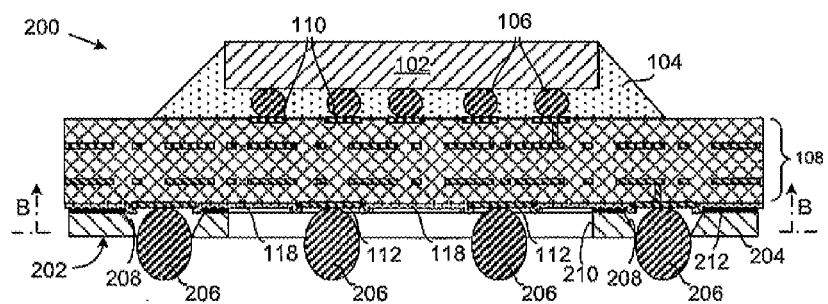
FIG. 2 is a schematic cross-sectional view along line A-A of FIG. 3, comparable to FIG. 1, of a surface mount semiconductor device in accordance with one embodiment of the invention, given by way of example.
Figure 3:
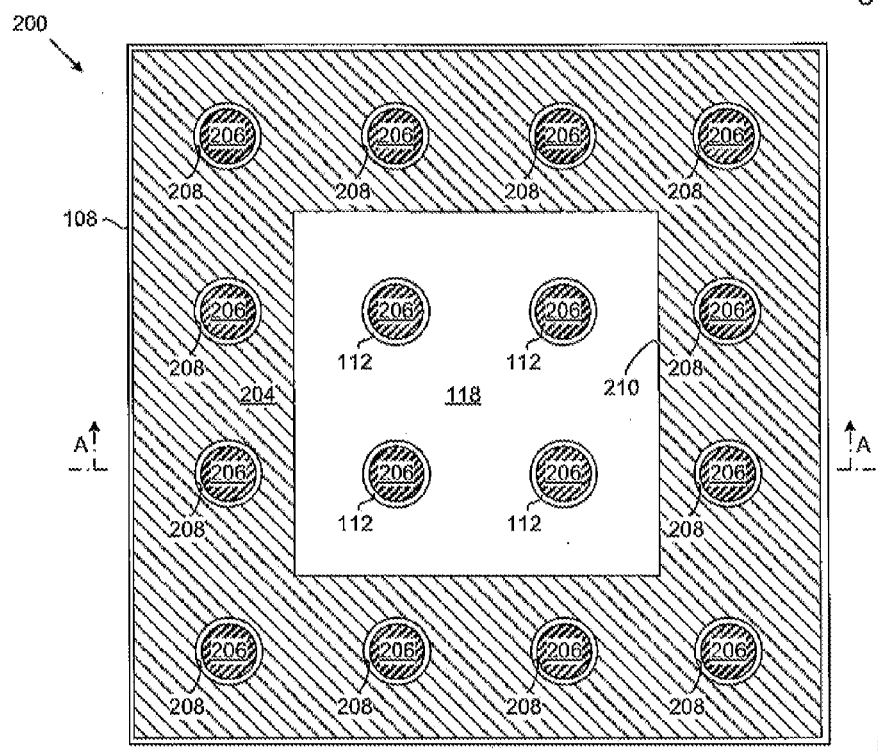
FIG. 3 is a schematic sectional view along line B-B of FIG. 2 from an active face of the semiconductor device.

Referring now to FIGS. 2 to 10, illustrate surface mount semiconductor devices 200, 400, 600, 700, 800, 900, 1000 in accordance with examples of embodiments of the present invention are shown. The semiconductor devices 200, 400, 600, 700, 800, 900, 1000 have an external active face 202, 1002, external solder balls 206, 602, 802, 902, 1004 exposed in an array at the external active face 202, 1002 for mechanical and electrical connection to an external support (not shown), a semiconductor die 102 electrically connected internally with the external solder balls 206, 602, 802, 902, 1004, and a reinforcement layer 204, 402, 702, 804, 904, 1006 of electrically insulating material extending between and surrounding laterally at least peripheral external solder balls 206, 602, 802, 902, 1004 of the array. The reinforcement layer 204, 402, 702, 804, 904, 1006 extends to at least thirty percent (30%) of the height of the peripheral external solder balls 206, 602, 802, 902, 1004 at the active face 202, 1002, and to less than fifty percent (50%) of the height of the peripheral contact elements external solder balls 206, 602, 802, 902, 1004 at the active face 202, 1002.

The reinforcement layer 204, 402, 702, 804, 904, 1006 may contact intimately and support laterally at least the peripheral external solder balls 206, 602, 802, 902, 1004. The reinforcement layer 204, 402, 702, 804, 904, 1006 comprise openings 208, 806, 906, 1008 surrounding laterally respective ones of the peripheral solder balls 206, 602, 802, 902, 1004. The openings 208, 906, 1008 may be tapered. The external solder balls 206, 602, 802, 902, 1004 typically will comprise solder balls and the openings 208, 806, 906, 1008 preferably include solder wettable linings 704 that contact the respective ones of the solder balls 602.

Figure 10:
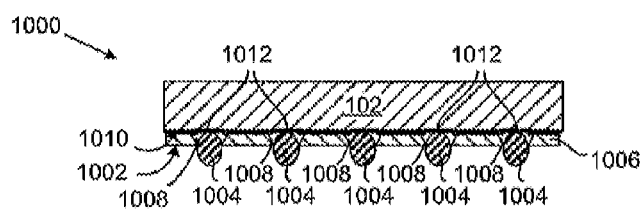
FIG. 10 is a cross-sectional view of a surface mount semiconductor device in accordance with yet another embodiment of the invention.

As illustrated in FIG. 10, the semiconductor die 102 may have an active face 1010 attached to the external contact elements 1008 solder balls 1004 and the reinforcement layer of electrically insulating material 1006.

As illustrated in FIGS. 2 to 9, the semiconductor device 200, 400, 600, 700, 800, 900 may include a substrate 108 having internal contact elements 112 connected electrically internally with the semiconductor die 102. The external solder balls 206, 602, 802, 902 electrically connect internally with the internal contact elements 112 of the substrate and are located on the active face of the substrate 108 of the semiconductor device. The reinforcement layer 204, 402, 702, 804, 904 of electrically insulating material adheres to the substrate 108. The substrate 108 preferably comprises laminated layers and the reinforcement layer 204, 402, 702, 804, 904 of electrically insulating material comprises at least one of the laminated layers at the external active face.

FIGS. 2 to 9 also illustrate the surface mount semiconductor devices 200, 400, 600, 700, 800, 900 having the external active face 202, substrate 108 having internal contact elements 112 in an array, external contact solder balls 206, 602, 802, 902 connected mechanically and electrically to respective ones of the internal contact elements 112 and exposed in an array at the external active face 202 for mechanical and electrical connection to an external support (not shown), semiconductor die 102 connected electrically internally with the internal contact elements 112, and a reinforcement member 204, 402, 702, 804, 904 of electrically insulating material located at the active face 202 and extending between at least the peripheral external contact solder balls 206, 602, 802, 902 of the array. The substrate 108 includes a solder mask layer 118 to which the reinforcement member adheres.

Figure 11:
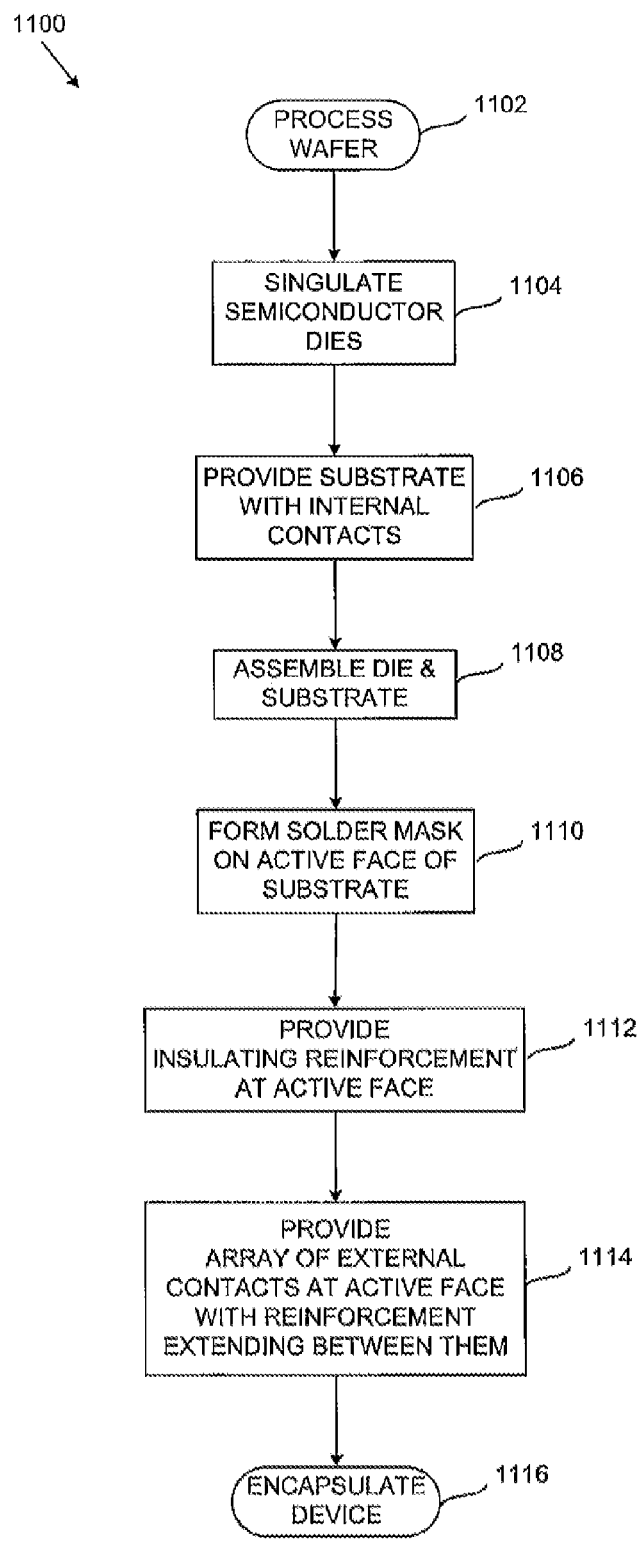
FIG. 11 is a flow chart of a method of assembling a surface mount semiconductor device in accordance with an embodiment of the invention.

FIG. 11 illustrates a method 1100 of making a surface mount semiconductor device, such as the semiconductor devices 200, 400, 600, 700, 800, 900, in accordance with an example of an embodiment of the present invention, having an external active face 202. The method 1100 comprises providing a semiconductor die 102, providing a substrate 108 having internal contact elements 112 in an array, assembling the semiconductor die 102 with the substrate 108 and connecting the internal contact elements 112 electrically internally with the semiconductor die 102, providing a reinforcement member 204, 402, 702, 804, 904 of electrically insulating material having an array of openings 208, 806, 906 corresponding with at least peripheral internal contact elements 112 of the array, assembling the reinforcement member 204, 402, 702, 804, 904 with the substrate 108 with the reinforcement member located at the active face 202, and providing external solder balls 206, 602, 802, 902 connected electrically internally with the internal contact elements 112 and exposed in an array at the external active face 202 for mechanical and electrical connection to an external support (not shown). The reinforcement member 204, 402, 702, 804, 904 extends between at least peripheral contact elements of the array.

Referring again to FIGS. 2 and 3, in more detail, a C5 semiconductor device 200 is shown. Like the semiconductor device 100, the semiconductor device 200 comprises one or more singulated semiconductor dies 102 embedded in a molding compound 104 and having electrical contact solder elements 106 of a ball grid array (BGA) at an active face of the die 102. The die 102 is mounted on a laminated substrate 108, which has electrically conductive layers and vias separated by insulating layers, and back face electrical contacts 110 formed on the back face of the substrate 108 to provide interconnections between the BGA of the semiconductor die 102 and an array of internal active face electrical contact pads 112 on the substrate 108 at the active face 202 of the device 100. A further array of electrical contact solder elements such as 206 form an external BGA at the active face 202 of the device 100. Patterning of the electrically conductive layers and vias in the substrate 108 enables the array of pads 106 on the semiconductor die 102 to be redistributed geometrically, so that the BGA 112, 116 at the active face 202 of the device 100 may have a different geometry from the BGA at the active face of the semiconductor die 102. A solder mask 118 is formed under the active face 202 of the device 200. The solder mask 118 may be applied to the substrate 108, for example by silk-screening, spraying or laminating a thin layer of lacquer or other polymer to protect the electrical contact pads 112 against oxidation and to prevent solder bridges from forming between closely spaced solder pads 206. Openings 208 are etched in the solder mask 118 for the individual external electrical contact solder balls 206 to contact the electrical contact pads 112.

Unlike the semiconductor device 100, the semiconductor device 200 also includes a reinforcement layer 204 of electrically insulating material extending between and surrounding laterally peripheral solder balls 206 of the array. The reinforcement layer 204 protects the peripheral external electrical contact solder balls 206 from damage during handling of the device 200 while the electrical solder balls 206 are stuck to the contact pads 112 at the active face 204 before soldering the device 200 to an external PCB. In the preferred embodiment, the reinforcement layer 204 extends to at least thirty percent (30%) of the height of the peripheral contact elements at the active face and less than fifty percent (50%) of the height of the peripheral contact elements at the active face.

The reinforcement layer 204 surrounds laterally the openings 208 and contacts the peripheral external electrical contact solder balls 206, shares any stress applied to the solder balls 206 and protects the solder balls 206 from damage during handling of the device 200. The reinforcement layer 204 has a central aperture 210 so that central electrical contact solder balls 206 of the external BGA at the active face 202 within the aperture 210 are not in intimate contact with the reinforcement layer 204, but nonetheless the reinforcement layer 204 forms a frame that also protects the central electrical contact solder balls 206 from lateral shock to a degree sufficient for many purposes.

Figure 4:
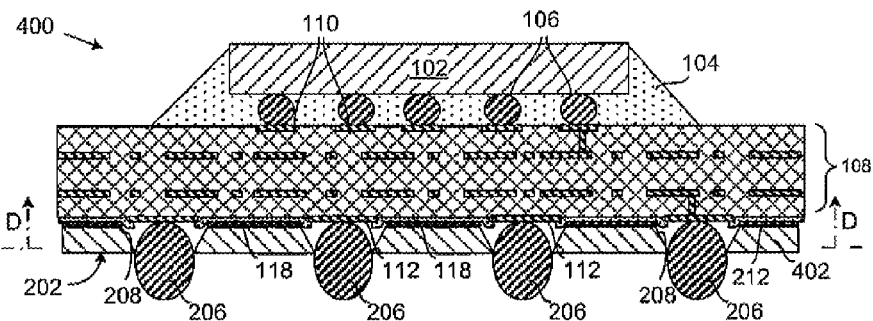
FIG. 4 is a schematic cross-sectional view along line C-C of FIG. 5 of a surface mount semiconductor device in accordance with another embodiment of the invention, given by way of example.
Figure 5:
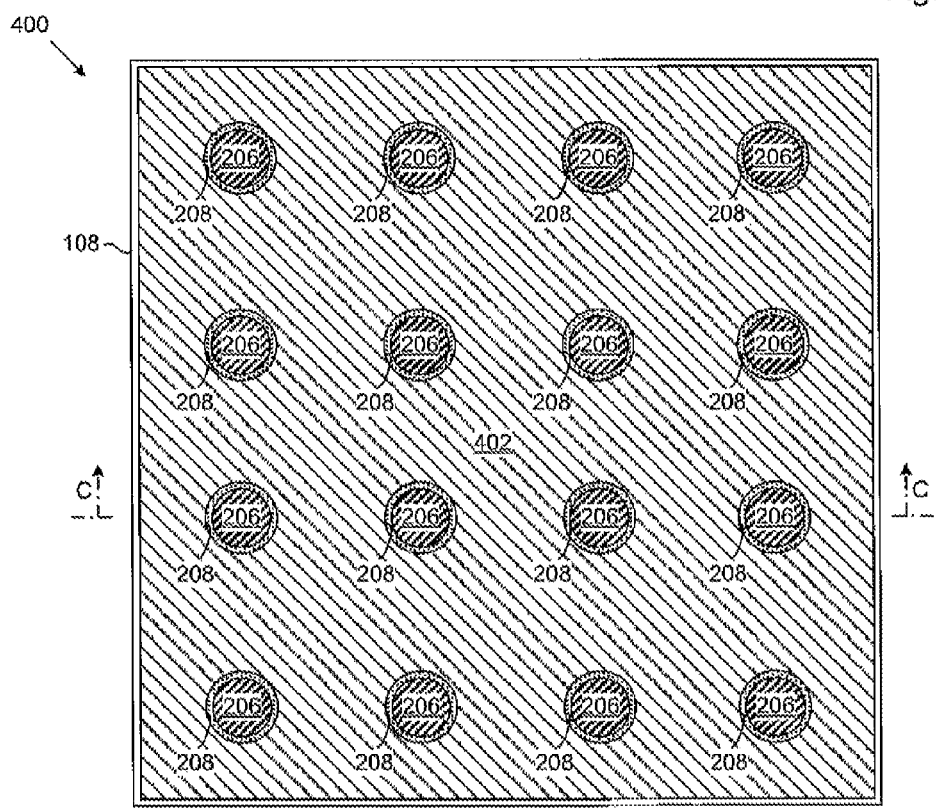
FIG. 5 is a schematic sectional view along line D-D of FIG. 4 from an active face of the semiconductor device of FIG. 3.

FIGS. 4 and 5 show another example of a C5 semiconductor device 400. Like the semiconductor device 200, the semiconductor device 400 includes a reinforcement layer 402 of electrically insulating material extending between and surrounding laterally solder balls 206 of the array. The reinforcement layer 402 does not have a central aperture such as 210 and not only contacts the peripheral external electrical contact solder balls 206 but also the central ones. The reinforcement layer 402 protects all the solder balls 206 equally from stress and damage during handling of the device 200 while the solder balls 206 are stuck to the contact pads 112 at the active face 204 before soldering the device 200 to an external PCB.

In one example, the reinforcement layer 204, 402, of electrically insulating material is a pre-fabricated part which is attached to the substrate 108 by a layer 212 of adhesive. In another example, the substrate 108 comprises laminated layers and the reinforcement layer 204, 402 of electrically insulating material is formed by at least one of the laminated layers at the external active face 202. In both cases, any thin layer of solder mask such as 118 formed at the active face 114 of the device is additional to the much thicker reinforcement layer 204, 402. The substrate 108, the reinforcement layer 204, 402 and the adhesive layer 212 may be made of any suitable material. In one example, the substrate 108, the reinforcement layer 204, 402 are made of a glass-reinforced epoxy laminate sheets such as FR-4 or a thermoset resin such as BT-epoxy or polyimide, and the adhesive layer may be a non-conductive paste or a silicone based adhesive.

In the examples shown in FIGS. 2 to 5, the shape of the openings 208 encourages intimate contact between the reinforcement layer 204 and the solder balls 206 before soldering the device 200 to an external PCB. In addition, the solder balls 206 expand into the taper during soldering, so that after soldering, the mechanical connection of the device 200, 400 to the external PCB is strengthened.

Figure 6:
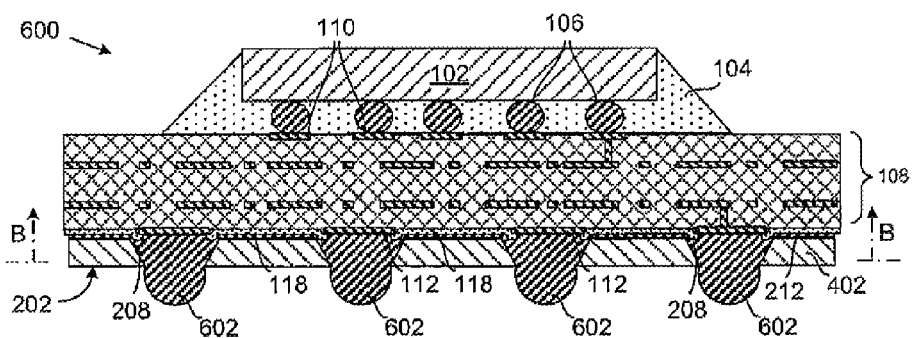
FIGS. 6 to 9 are schematic cross-sectional views of surface mount semiconductor devices in accordance with yet other embodiments of the invention, given by way of example.
Figure 7:
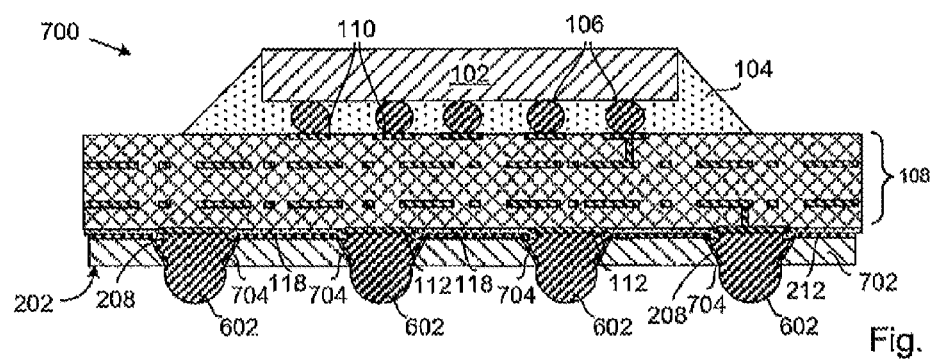

FIGS. 2 to 5 show the solder balls 206 as having an oval shape (before soldering to a PCB). FIGS. 6 and 7 illustrate C5 semiconductor devices 600 and 700 that are variants of the semiconductor device 400, with solder bumps 602 of generally conical shape filling the tapered openings 208, instead of the balls 206. The solder bumps 602 key into the cavities under the surface of the reinforcement layer 204, 402, enhancing resistance of the solder bumps 602 to damage caused by stress and shocks. In addition, in the example of the semiconductor device 700, the tapered openings 208 have solder wettable linings 704 that enhance the conformity and adhesion of the solder bumps 602 to the openings 208 after soldering. Similar variants are possible with the configuration of FIGS. 2 and 3, where the reinforcement layer 204 has a central aperture 210.

Figure 8:
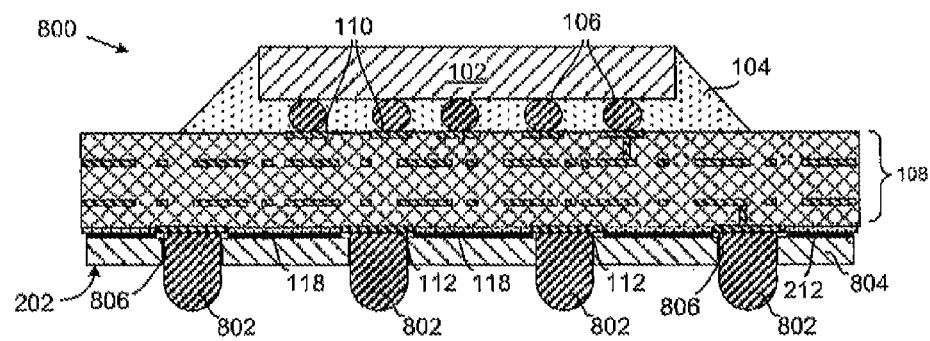

FIG. 8 illustrates a C5 semiconductor device 800 that is a variant of the semiconductor device 400, with generally cylindrical solder bumps 802 in intimate contact with the reinforcement layer 804, which is similar to the reinforcement layer 204 or 402 but with cylindrical openings 806 in the reinforcement layer 804. This configuration allows for taller solder balls than the configurations of the devices 200, 400, 600, 700, enhancing solder bump stand-off and the reliability of solder joints with a PCB when in use.

Figure 9:
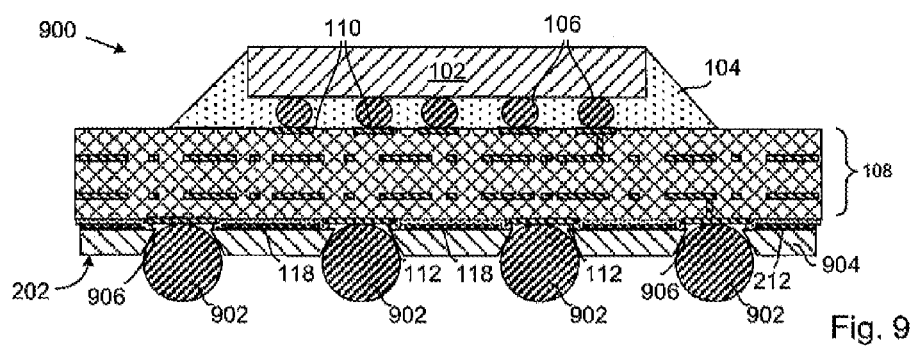

FIG. 9 illustrates a C5 semiconductor device 900 that is another variant of the semiconductor device 400. In the semiconductor device 900, the solder balls 902 are spherical and the reinforcement layer 904 surrounds laterally at least the peripheral solder balls 902 with conical shaped openings 906 that widen out or taper away from the substrate 202. This configuration enables a greater area of contact between the openings 906 and the solder balls 902 to share any stress applied to the solder balls 902 and protect them from damage during handling of the device 200.

FIG. 10 illustrates a C4 semiconductor device 1000 that is yet another example of an embodiment of the invention. The semiconductor device 1000 does not have a substrate such as 108 but has an external active face 1002, external contact elements 1004 exposed in an array at the external active face 1002 for mechanical and electrical connection to an external support (not shown), attached directly to a semiconductor die 102 connected electrically internally with the external contact elements 1004. A reinforcement layer 1006 of electrically insulating material extends between and surrounds laterally at least peripheral external contact elements 1004 of the array. The reinforcement layer 1006 extends to at least thirty percent (30%) and less than fifty percent (50%) of the height of the peripheral contact elements at the active face 1002. The reinforcement layer comprises openings 1008 surrounding laterally respective ones of at least the peripheral external contact elements 1004. The semiconductor die 102 has an active face 1010 with contact pads 1012 attached directly to the external contact elements 1008 1004 and the reinforcement layer of electrically insulating material 1006, which is prefabricated. As shown, the openings 1008 are tapered, with the taper closing in away from the semiconductor die 102 to form conical cavities. However, in other examples (not shown), the reinforcement layer 1006 and the external contact elements 1004 have the configurations of any of the reinforcement layers 204, 402, 702, 804, 904 and the external solder balls 206, 602, 802, 902.

FIG. 11 illustrates a method 1100 of assembling a surface mount semiconductor device, in accordance with an example of an embodiment of the present invention. The method 1100 is applicable to assembling the semiconductor devices 200, 400, 600, 700, 800, 900, and is described with reference to making such devices, but is also applicable to making other semiconductor devices.

The method starts at 1102 by processing a semiconductor wafer to produce an array of semiconductor integrated circuits. At 1104, semiconductor dies 102 comprising the integrated circuits are singulated from the wafer. At 1106, a substrate 108 is provided for each of the semiconductor dies 102, each of the substrates 108 having internal contact elements 112 in an array. The semiconductor die 102 is assembled with the substrate 108 at 1108 and the internal contact elements 112 are electrically connected internally with the semiconductor die 102. The substrate 108 may be fabricated at 1106 with a solder mask 118 or may be provided with a solder mask at a step 1110; alternatively the solder mask 118 may be omitted.

A reinforcement member 204, 402, 702, 804, 904 of electrically insulating material having an array of openings 208, 806, 906 corresponding with at least peripheral internal contact elements 112 of the array is provided at 1112. The reinforcement member 204, 402, 702, 804, 904 is attached to the active face 202 of the substrate 108 through the solder mask 118 (if included) by a layer 212 of adhesive. At 1114, an array of external solder balls 206, 602, 802, 902 is provided to electrically connect internally with the internal contact elements 112 and exposed at the external active face 202 for mechanical and electrical connection to an external support. The reinforcement member 204, 402, 702, 804, 904 extends between at least peripheral contact elements of the array. Alternatively, the external solder balls 206, 602, 802, 902 may be assembled with the reinforcement member 204, 402, 702, 804, 904 when the reinforcement member is pre-fabricated and attached to the internal contact elements 112 when the reinforcement member and the substrate 108 are assembled together. At 1116, the device is encapsulated.

It will be appreciated that a semiconductor device such as 200, 400, 600, 700, 800, 900 may include more than one semiconductor die 102 having respective sets of internal contact elements 112. The semiconductor die 102 may be connected with the internal contact elements 112 by bond wires instead of a BGA on the semiconductor die.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Further, terms such as "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specification and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A surface mount semiconductor device, comprising:
an external active face;
external contact elements exposed in an array at said external active face for mechanical and electrical connection to an external support;
a semiconductor die connected electrically internally with said external contact elements; and
a reinforcement layer of electrically insulating material extending between and surrounding laterally at least peripheral ones of said external contact elements of said array, wherein said reinforcement layer comprises openings surrounding laterally respective ones of said peripheral external contact elements, and wherein said openings are tapered with the taper closing in away from the semiconductor die to form conical cavities such that said reinforcement layer contacts intimately and supports at least said peripheral external contact elements;
wherein said reinforcement layer extends to at least thirty percent (30%) of the height of said peripheral external contact elements at said active face.

2. The semiconductor device of claim 1, wherein said reinforcement layer extends to less than fifty percent (50%) of the height of said peripheral external contact elements at said active face.

3. The semiconductor device of claim 1, wherein said external contact elements comprise solder elements and said openings comprise solder wetting linings contacting said respective ones of said solder elements.

4. The semiconductor device of claim 1, wherein said semiconductor die has an active face attached to said external contact elements and said reinforcement layer of electrically insulating material.

5. The semiconductor device of claim 1, further comprising:
a substrate having internal contact elements electrically connected internally with said semiconductor die, wherein said external contact elements connect electrically internally with said internal contact elements of said substrate and are located on said substrate at said active face of said semiconductor device.

6. The semiconductor device of claim 5, wherein said reinforcement layer of electrically insulating material adheres to said substrate.

7. The semiconductor device of claim 5, wherein said substrate comprises laminated layers and said reinforcement layer of electrically insulating material comprises at least one of said laminated layers at said external active face.

8. A surface mount semiconductor device, comprising:
an external active face;
a substrate having internal contact elements in an array;
external contact solder elements connected mechanically and electrically to respective ones of said internal contact elements and exposed in an array at said external active face for mechanical and electrical connection to an external support;
a semiconductor die connected electrically internally with said internal contact elements; and
a reinforcement member of electrically insulating material located at said active face and extending between at least peripheral ones of said external contact solder elements of said array, wherein said reinforcement member comprises openings that laterally surround respective ones of said peripheral external contact solder elements, wherein said openings are tapered with the taper closing in away from the semiconductor die to form conical cavities such that said reinforcement member contacts and supports said peripheral external contact solder elements;
wherein said substrate includes a solder mask layer to which said reinforcement member adheres.

9. The semiconductor device of claim 8, wherein said openings include solder wetting linings contacting said respective ones of at least said peripheral external contact solder elements.

10. A method of assembling a surface mount semiconductor device having an external active face, the method comprising:
providing a semiconductor die;
providing a substrate having an array of internal contact elements;

attaching the semiconductor die to the substrate and electrically connecting the internal contact elements to the semiconductor die;

providing a reinforcement member of electrically insulating material having an array of openings corresponding with at least peripheral ones of the internal contact elements of the array;

assembling the reinforcement member with the substrate, wherein the reinforcement member is located at said external active face; and providing external contact elements connected electrically internally with the internal contact elements and exposed in an array at said external active face for mechanical and electrical connection to an external support;

wherein the reinforcement member extends between at least peripheral ones of said external contact elements, wherein the openings are tapered with the taper closing in away from the semiconductor die to form conical cavities such that the reinforcement member intimately contacts and supports the peripheral external contact elements.

11. The method of claim 10, wherein the external contact elements comprise solder balls and the openings comprise solder wetting linings contacting respective ones of at least the peripheral external contact elements.

12. The method of claim 10, wherein the reinforcement layer extends to at least thirty percent (30%) of the height of the peripheral external contact elements at the active face.

13. The method of claim 12, wherein the reinforcement layer extends to less than fifty percent (50%) of the height of the peripheral external contact elements at the active face.

* * * * *